(12) United States Patent
Korevaar et al.

(10) Patent No.: US 7,977,568 B2
(45) Date of Patent: Jul. 12, 2011

(54) MULTILAYERED FILM-NANOWIRE COMPOSITE, BIFACIAL, AND TANDEM SOLAR CELLS

(75) Inventors: Bastiaan Arie Korevaar, Schenectady, NY (US); Loucas Tsakalakos, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 699 days.

(21) Appl. No.: 11/622,275

(22) Filed: Jan. 11, 2007

(65) Prior Publication Data

US 2008/0169017 A1 Jul. 17, 2008

(51) Int. Cl.
*H01L 31/00* (2006.01)
*H01L 27/14* (2006.01)

(52) U.S. Cl. ........ 136/255; 136/258; 136/261; 257/431; 257/461; 257/465; 977/712; 977/720; 977/760; 977/948; 977/954

(58) Field of Classification Search .................. 136/243, 136/285, 260, 263, 264, 255, 258, 261; 257/292, 257/293, 431, 461, 465; 977/712, 720, 760, 977/948, 954
See application file for complete search history.

(56) References Cited

U.S. PATENT DOCUMENTS

| | | | |
|---|---|---|---|
| 4,079,124 A | 3/1978 | Winchell | |
| 4,332,974 A * | 6/1982 | Fraas | 136/249 |
| 5,580,492 A | 12/1996 | Bonnemann et al. | |
| 5,665,331 A | 9/1997 | Bagchi et al. | |
| 5,851,508 A | 12/1998 | Greff et al. | |
| 5,928,626 A | 7/1999 | Klaveness et al. | |
| 6,198,091 B1 * | 3/2001 | Forrest et al. | 250/214.1 |
| 6,203,778 B1 | 3/2001 | Brasch | |
| 6,417,244 B1 | 7/2002 | Wellinghoff et al. | |
| 6,660,248 B2 | 12/2003 | Wilson et al. | |
| 6,743,936 B1 | 6/2004 | Wellinghoff et al. | |
| 6,955,639 B2 | 10/2005 | Hainfeld et al. | |
| 2004/0109666 A1 * | 6/2004 | Kim, II | 385/147 |
| 2005/0072456 A1 * | 4/2005 | Stevenson et al. | 136/244 |
| 2005/0121068 A1 * | 6/2005 | Sager et al. | 136/252 |
| 2005/0214967 A1 * | 9/2005 | Scher et al. | 438/63 |

(Continued)

FOREIGN PATENT DOCUMENTS

WO WO 03/075961 A1 9/2003

(Continued)

OTHER PUBLICATIONS

Lim et al., A novel structure, high conversion efficiency p-SiC/graded p-SiC/i-Si/n-Si/metal substrate-type amorphous silicon solar cell, J. Appl. Phys. 56(2), Jul. 15, 1994, p. 538-542.*

(Continued)

*Primary Examiner* — Jeffrey T Barton
*Assistant Examiner* — Devina Pillay
(74) *Attorney, Agent, or Firm* — Paul J. DiConza (57) ABSTRACT

A photovoltaic device includes a substrate having at least two surfaces and a multilayered film disposed on at least a portion of at least one surface of the substrate. Elongated nanostructures are disposed on the multilayered film. The device incorporates a top layer of the multilayered film contacting the elongated nanostructures that is a tunnel junction. The device has at least one layer deposited over the elongated nanostructures defining a portion of a photoactive junction. A solar panel includes at least one photovoltaic device. The solar panel isolates each such devices from its surrounding atmospheric environment and permits the generation of electrical power.

21 Claims, 5 Drawing Sheets

U.S. PATENT DOCUMENTS

| | | |
|---|---|---|
| 2006/0084278 A1 | 4/2006 | Winter et al. |
| 2007/0111368 A1 | 5/2007 | Zhang et al. |
| 2007/0137697 A1* | 6/2007 | Kempa et al. ............. 136/256 |

FOREIGN PATENT DOCUMENTS

| | | |
|---|---|---|
| WO | WO 2005/051435 A1 | 6/2005 |
| WO | WO 2006/025627 A1 | 3/2006 |
| WO | WO 2006/054240 A2 | 5/2006 |

OTHER PUBLICATIONS

Li, "Highly-ordered carbon nanotube arrays for electronic applications" Applied Physics Letters, vol. 75 No. 3, p. 367-369, Jul. 1999.*

Braune et al., "Tantalum oxide nanomers for optical applications", SPIE Conf. on Org./Inorg. Hybrid Mat. for Photonics, San Diego, CA, (Jul. 1998), pp. 124-132.

Parraud et al., "Stabilization and Characterization of Nanosized Niobium . . . " 75 (8) J. Am. Ceram. Soc. (1992), pp. 2289-2292.

Yu et al., "Metal-Based X-ray Contrast Media", 99 Chem. Rev. (1999), pp. 2353-2377.

Li et al., "A Novel Simple Route to Synthesize Aqueous Niobium and Tantalum Precursors . . . ", 942 Mater. Res. Soc. Symp. Proc. (2006).

Tomita et al., "A Water-Soluble Titanium Complex for the Selective Synthesis of Nanocrystalline . . . ", 45 Angew. Chem. Int. Ed. (2006), pp. 2378-2381.

Kominami et al., "Solvothermal synthesis of tantalum(v) oxide nanoparticles and their photocatalytic activities . . . ", 3 Phys. Chem. Chem. Phys. (2001), pp. 2697-2703.

Sun et al., "Sol-Gel Chemistry of Tantala HR Coatings: Structure and Laser-Damage Resistance", 8 J. Sol-Gel Sci & Tech. (1997), pp. 493-497.

Ozer et al., "Structural and Optical Properties of Sol-Gel Deposited Proton Conducting Ta2O5 Films", 8 J. Sol-Gel Sci. & Tech. (1997), pp. 703-709.

Romero et al., "Synthesis of Ta2O5 Nanorods in the Presence of Poly L-Lysine by a Sol-Gel Process", 95 Annali de Chimica (2005), pp. 703-707.

Yordanov et al., "Novel Iodinated Dendritic Nanoparticles for Computed Tomography (CT) Imaging", 2(6) Nano Letters (2002), pp. 595-599.

Bonnemann et al., "Nanoscopic Metal Particles—Synthetic Methods and Potential Applications", Eur. J. Inorg. Chem. (2001), pp. 2455-2480.

Monreal et al., "Synthesis of nanoparticles of tantalum(v) oxide in presence of D-galactose 3,6 anhydro-L-galactose", 27(1/2) Int. J. Mat. Prod. Tech. (2006), pp. 80-84.

Fang et al., "Surface sol-gel synthesis of ultrathin titanium and tantalum oxide films", 1 J. Nanoparticle Res. (1999), pp. 43-49.

* cited by examiner

MULTILAYERED FILM-NANOWIRE COMPOSITE, BIFACIAL, AND TANDEM SOLAR CELLS

RELATED APPLICATIONS

This present application is related to commonly assigned co-pending application U.S. Ser. No. 11/599,722, filed Nov. 15, 2006, entitled "Graded Hybrid Amorphous Silicon Nanowire Solar Cells" and co-pending application U.S. Ser. No. 11/599,677, filed Nov. 15, 2006, entitled "Amorphous-Crystalline Tandem Nanostructured Solar Cells," and to commonly assigned co-pending application U.S. Ser. No. 11/622,295, filed concurrently herewith, entitled "Nanowall Solar Cells and Optoelectronic Devices."

TECHNICAL FIELD

The present invention relates generally to solar cells, and more specifically to such solar cells that may include elongated nanostructures disposed over a multilayered film.

BACKGROUND INFORMATION

Presently, silicon (Si) is the most commonly used material in the fabrication of solar cells, such solar cells being used for converting sunlight into electricity. Single and multi-junction p-n solar cells are used for this purpose, but none are efficient enough to significantly reduce the costs involved in the production and use of this technology. Consequently, competition from conventional sources of electricity precludes the widespread use of such solar cell technology.

Most electronic and optoelectronic devices require the formation of a junction. For example, a material of one conductivity type is placed in contact with a different material of the opposite conductivity type to form a heterojunction. Alternatively, one may pair differentially doped layers made of a single material type to generate a p-n junction (or homojunction). Abrupt band bending at a heterojunction due to a change in conductivity type and/or variations in band gap may lead to a high density of interface states that result in charge carrier recombination. Defects introduced at the junction during fabrication may further act as sites for charge carrier recombination that degrade device performance.

While the ideal thermodynamic efficiency of a solar converter is ~85%, there is a loss in efficiency due to the fact that sub-bandgap energy photons in the solar spectrum are not absorbed. This loss alone, when applied with black-body radiation, limits the conversion efficiency of a single junction cell to about 44% (the so-called ultimate efficiency). Further taking into account the real solar spectrum normalized to a black body temperature, the temperature of the solar cell, the shape of the solar cell, the cell's refractive index, and the diode equations, Shockley and Queisser were able to show that the performance of a single junction cell was limited to just over 30 percent efficiency for an optimal cell with a bandgap of 1.45 electron volts (eV) and under 1 sun illumination, and just over 40% for maximum concentration (Shockley and Queisser, "Detailed Balance Limit of Efficiency of p-n Junction Solar Cells," J. Appl. Phys., 1961, 32(3), pp. 510-519). More recent calculations have shown this "detailed balance limit efficiency" for a single junction to be 29 percent (Kerr et al., "Lifetime and efficiency of limits of crystalline silicon solar cells," Proc. 29th IEEE Photovoltaic Specialists Conference, 2002, pp. 438-441). Additionally, recombination of photo-generated electrons and holes with trap states in the semiconductor crystal associated with point defects (interstitial impurities), metal clusters, line defects (dislocations), planar defects (stacking faults), and/or grain boundaries further reduces the efficiency. Although this latter reduction in efficiency can be overcome by using other materials with appropriate properties (particularly long diffusion lengths of the photo-generated carriers), this still does not bring this technology to a cost parity with more conventional sources of electricity.

Defect states due to structural imperfections or impurity atoms can reside on the surface and within the bulk of monocrystalline semiconductors. In addition, polycrystalline semiconductor materials are comprised of randomly-oriented crystal grains with grain boundaries, the grain boundaries inducing a large number of bulk and surface defect states. Because charge carriers can recombine at defect sites and are therefore lost as current carriers, defects typically adversely affect the operation or performance of electronic and/or optoelectronic devices such as solar cells. Accordingly, the surfaces of monocrystalline or polycrystalline semiconductor substrates are often passivated during device fabrication in order to minimize the negative effects of surface defects. One method for surface passivation is by forming a layer of intrinsic (undoped) amorphous semiconductor material on the monocrystalline or polycrystalline semiconductor substrate. This decreases the recombination of charge carriers at the substrate surface and improves the performance of the device.

The absorption capacity of the materials making up a PV device may also affect the efficiency of the cell. A p-i-n thin film solar cell having an i-type semiconductor absorber layer formed of a variable bandgap material, said i-layer being positioned between a p-type semiconductor layer and an n-type semiconductor layer has been described. See U.S. Pat. No. 5,252,142. A variable bandgap i-layer absorber provides for improved photoelectric conversion efficiency.

Multi-junction solar cells have been demonstrated to have improved efficiencies as well. The improved performance may be achieved by incorporating stacked junctions with differing band gaps to capture a broader area of the light spectrum. Such devices are typically constructed with stacked p-n junctions or stacked p-i-n junctions. Each set of junctions in this array is often referred to as a cell. A typical multi-junction solar cell includes of two or three cells stacked together. The optimal bandgaps and theoretical efficiencies for multi-junction solar cells as a function of number of cells in the stack has been analyzed theoretically by Marti and Araujo (A. Marti and G. L. Araujo, Sol. Ener. Mater. Sol. Cells, 1996, 43(2), pp. 203-222).

Nanostructures

Silicon nanowires have been described in p-n junction diode arrays (Peng et al., "Fabrication of large-Area Silicon Nanowire p-n Junction Diode Arrays," Adv. Mater., 2004, vol. 16, pp. 73-76). Such arrays, however, were not configured for use in photovoltaic devices, nor was it suggested how such arrays might serve to increase the efficiency of solar cells.

Silicon nanostructures have been described in solar cell devices (Ji et al., "Silicon Nanostructures by Metal Induced Growth (MIG) for Solar Cell Emitters," Proc. IEEE, 2002, pp. 1314-1317). In such devices, Si nanowires can be formed, embedded in microcrystalline Si thin films, by sputtering Si onto a nickel (Ni) pre-layer, the thickness of which determines whether the Si nanowires grow inside the film or not. However, such nanowires are not active photovoltaic (PV) elements; they merely serve in an anti-reflective capacity.

Solar cells comprising silicon nanostructures, where the nanostructures are active PV elements, have been described in commonly-assigned co-pending U.S. patent application Ser. No. 11/081,967, filed Mar. 16, 2005. In that particular Application, the charge separating junctions are largely contained within the nanostructures themselves, generally requiring doping changes during the synthesis of such nanostructures.

As a result of the foregoing, incorporating multi-junction cells over a nanostructured scaffold and fabrication methods that reduce the impact of defects may lead to solar cells with efficiencies on par with the more traditional sources of electricity. Thus, there is a continuing need to explore new configurations for PV devices. This is especially the case for nanostructured devices, which may benefit from enhanced light trapping and shorter paths for charge transport upon light absorption.

SUMMARY OF THE INVENTION

Embodiments disclosed herein provide a photovoltaic device that includes: a substrate having at least two surfaces, a multilayered film disposed on at least a portion of at least one surface of the substrate, a plurality of elongated nanostructures disposed on the multilayered film, a tunnel junction; and at least one layer deposited over the plurality of elongated nanostructures. The layers deposited over the nanostructures generally provide a portion of photoactive junction.

In other aspects, embodiments disclosed herein provide a method of making a photovoltaic device such devices and incorporating them in a solar panel. A solar panel includes at least one photovoltaic device wherein the solar panel isolates such devices from its surrounding atmospheric environment and permits the generation of electrical power.

Advantageously, the photoactive devices are multi-junction arrays that capture broad spectrum of light energy and, in some embodiments incorporate materials between elongated nanostructures to prevent shorting.

The foregoing has outlined rather broadly the features of the present invention in order that the detailed description of the invention that follows may be better understood. Additional features and advantages of the invention will be described hereinafter, which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

In some embodiments, a photovoltaic (PV) device may include, but is not limited to: (1) a multilayered film disposed on a substrate (2) elongated nanostructures, which may be disposed on the top layer of the multilayered film, and (3) at least one layer disposed over the elongated nanostructures. These layers disposed over the elongated nanostructures may be conformally disposed over the elongated nanostructures. The various layers of the multilayered film and the layers disposed about the elongated nanostructures may form portions of photoactive junctions, such as p-n and p-i-n junctions, for example. These photoactive junctions may be stacked with tunnel junctions separating each cell in the multi-junction array. Each cell in the multi-junction array may be arranged in series and may include p-n junctions, p-i-n junctions, and combinations thereof. In some embodiments, the elongated nanostructures may be part of a photoactive junction and be appropriately doped with p-dopants or n-dopants. Finally, in some embodiments, the multilayered film, the elongated nanostructures, and the layers disposed about the elongated nanostructures may be arranged in a bifacial arrangement on opposing surfaces of the substrate of the PV device.

In the following description, specific details are set forth such as specific quantities, sizes, etc. so as to provide a thorough understanding of embodiments of the present invention. However, it will be obvious to those skilled in the art that the present invention may be practiced without such specific details. In many cases, details concerning such considerations and the like have been omitted inasmuch as such details are not necessary to obtain a complete understanding of the present invention and are within the skills of persons of ordinary skill in the relevant art.

Referring to the drawings in general, it will be understood that the illustrations are for the purpose of describing a particular embodiment of the invention and are not intended to limit the invention thereto.

While most of the terms used herein will be recognizable to those of skill in the art, the following definitions are nevertheless put forth to aid in the understanding of the present invention. It should be understood, however, that when not explicitly defined, terms should be interpreted as adopting a meaning presently accepted by those of skill in the art.

A "photovoltaic device," as defined herein, is a device comprising at least one photodiode and which utilizes the photovoltaic effect to produce an electromotive force (e.m.f.). See Penguin Dictionary of Electronics, Third Edition, V. Illingworth, Ed., Penguin Books, London, 1998. An exemplary such device is a "solar cell," wherein a solar cell is a photodiode whose spectral response has been optimized for radiation from the sun.

"Nanoscale," as defined herein, generally refers to dimensions below 1 µm.

"Nanostructures," as defined herein, generally refer to structures that are nanoscale in at least one dimension.

"Elongated nanostructures," as defined herein, are nanostructures having at least at least one cross sectional dimension that is less than about 500 nm and has an aspect ratio (e.g., length:width) of greater than 3. Exemplary such elongated nanostructures include, but are not limited to, nanowires, nanorods, nanotubes, and the like.

"Nanowires," as defined herein, are generally elongated nanostructures typically being sub-micron (<1 µm) in at least two dimensions and having a largely cylindrical shape. They are frequently single crystals.

"Conformal," as defined herein, pertains to coatings that largely adopt (i.e., conform to) the shape of the structures which they coat. This term should be interpreted broadly, however, permitting the substantial filling of void space between the coated structures—at least in some embodiments. A single conformal layer may vary in thickness along different sections of the structure being coated.

"Semiconducting material," as defined herein, is material that has a conductivity that is generally intermediate between metals and insulators, and wherein such a material has an energy gap, or "bandgap," between its valence and conduction bands. In its pure, undoped state, such semiconducting material is typically referred to as being "intrinsic."

"Poly Silicon (Poly-Si)," as defined herein, refers to polycrystalline silicon. Such materials are composed of multiple crystal domains.

"Amorphous," as defined herein, refers to a material with an unordered form and a substantially random internal structure.

"p-doping," as defined herein, refers to doping of semiconducting material with impurities that introduce holes effective for increasing the conductivity of the intrinsic semiconducting material and moving the Fermi level towards the valence band such that a junction can be formed. An exemplary such p-doping is the addition of small quantities of boron (B) to silicon (Si).

"n-doping," as defined herein, refers to doping of semiconducting material with impurities that introduce electrons effective for increasing the conductivity of the intrinsic semiconducting material and moving the Fermi level towards the conduction band such that a junction can be formed. An exemplary such n-doping is the addition of small quantities of phosphorous (P) to silicon (Si).

A "charge separating junction," as defined herein, comprises a boundary between materials of different type (e.g., differing dopants and/or bulk composition) that allows for the separation of electrons and holes due to the presence of a potential barrier and electric field gradient.

A "heterojunction," as defined herein and pertaining to photovoltaic devices, is a charge-separating junction established via the contact of two differing semiconductor materials having differing bandgaps.

"Active PV elements," as defined herein, are those elements of a PV device responsible for establishing a charge-separating junction and responsible for the light absorption that is to contribute to the output current.

A "p-n photovoltaic device," as defined herein, is a device comprising at least one photodiode comprising a charge-separating junction established via the contact of a p-doped semiconductor and an n-doped semiconductor.

A "p-i-n photovoltaic device," as defined herein, is a stack of three materials with one layer being doped p-type (primarily hole conduction), one being undoped (i.e., intrinsic), and the other being doped n-type (primarily electron conduction).

"Multijunction," as defined herein, is a tandem array of stacked photoactive junctions which may include p-n and/or p-i-n junctions. Each photoactive junction may be separated from its neighboring cell by a tunnel junction.

"Solar cell," as defined herein, is essentially a photovoltaic device for energy conversion from solar radiation.

"Nanotemplates," as defined herein, are inorganic or organic films comprising an array of pores or columns having nanoscale dimensions. The pores generally run through the film in a substantially perpendicular direction relative to the plane of the film.

Device Configurations

Figure 1:
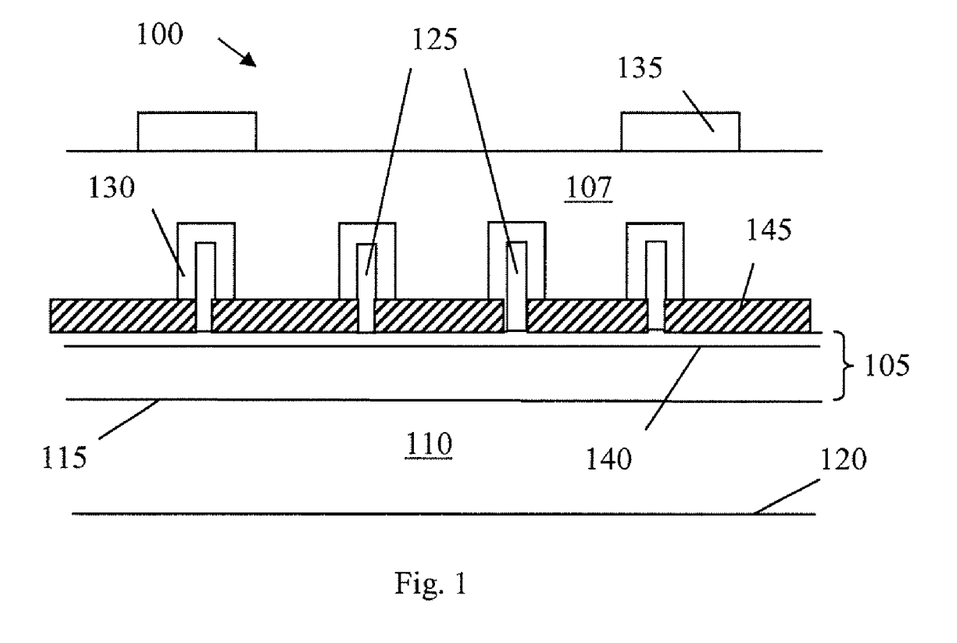
FIG. 1 shows a cross-sectional view of a photovoltaic device, in accordance with embodiments disclosed herein.

Referring to FIG. 1, in some embodiments, a photovoltaic device 100 may include, but is not limited to: (a) a substrate 110 having at least two surfaces 115 and 120; (b) a multilayered film 105 disposed on at least a portion of substrate 110; (c) elongated nanostructures 125 disposed on tunnel junction 140; and (d) at least one layer 130 disposed over elongated nanostructures 125.

Substrate 110 may be glass, ceramic, or metal, for example. In some embodiments, the elements of PV device 100 may be placed on surface 115. In alternate embodiments, the elements of PV device 100 may be placed in a bifacial arrangement on surfaces 115 and 120 (vide infra). In some embodiments, the at least one layer 130 may be deposited over the elongated nanostructures 125.

The multilayered film 105 may include a polycrystalline layer which may be polycrystalline silicon (poly-silicon or poly-Si), for example, and may be a p-doped semiconductor, in one embodiment and an n-doped semiconductor, in another embodiment. In some embodiments, other layers of multilayered film 105 may include single crystalline layers and amorphous layers. The multilayered film 105 represents components of one or more photoactive junctions, which may be p-n or p-i-n junctions. The top layer of the multilayered film is generally a tunnel junction layer 140.

Elongated nanostructures 125 may be placed on tunnel junction 140 with the aid of a template 145 placed over the tunnel junction layer. In some embodiments, template 145 is not necessary. A thin film of material that is the same composition as elongated nanostructures 125 may be laid on the tunnel junction in lieu of template 145. Elongated nanostructures 125 may then be grown on the film from appropriately distributed nanoparticle catalysts on the surface. Thus elongated nanostructures 125 form a continuum of material with the surface of the thin film laid over tunnel junction 140.

The conformal layer 130 may disposed over elongated nanostructures 125 only, when template 145 is used. In some embodiments, template 145 is a nanoporous template. In the absence of template 145, the conformal layers may extend between the elongated nanostructures, forming a continuous conformal layer. For example, the first conformal layer 130 deposited would be disposed over elongated nanostructures 125 as well as directly on tunnel junction 140. A given conformal layer 130 may form at least a portion of a photoactive junction, in one embodiment. In some embodiments, the photoactive junction may be a p-n junction and, in other embodiments, it may be a p-i-n junction. In yet another embodiment, at least one layer 130 may include a tunnel junction. A tandem multi-junction array is formed with the multilayered film 105, conformal layers 130 over elongated nanostructure 125.

In some embodiments, a layer of transparent conductive material (TCM) 107 is deposited over layer 130. TCM 107 may substantially fill the spaces between the plurality of coated, elongated nanostructures, however this is not necessary. Additionally, TCM 107 may form a nominally flat surface over the top of the plurality of elongated nanostructures. Furthermore, top 135 and bottom (not shown) contacts may be provided operable for connecting the device to an external circuit, wherein the bottom electrode is typically (but not always) integrated with the substrate.

Finally, in some embodiments, a PV device configuration may be disposed in a bifacial arrangement on the substrate. That is, multilayered film 105 may be disposed on substrate 110 on surfaces 115 and 120. Likewise, elongated nanostructures 125 may be disposed on each side of substrate 110. After conformally depositing amorphous layers 130 on each side, TCM 107 is provided, along with contacts 135 for connecting the device to an external circuit. Furthermore, in this configuration the PV device may be equipped with mirrors (not shown), so that light that does not impinge on the top set of photoactive junctions may be reflected to interact with the bottom set of photoactive junctions.

Device Components

The elongated nanostructures typically have a length in the range of about 100 nm to about 100 µm, and a width in the range of about 5 nm to about 1 µm. In some embodiments, the nanostructures are arranged on the substrate, polycrystalline, or tunnel junction layer (depending on configuration) in a vertical orientation, i.e., in relation to the plane of the these layers. In other embodiments, the elongated nanostructures are disposed in a largely random manner. One skilled in the art will appreciate that elongated nanostructures may be disposed at angles between 0 and 90 degrees.

In some embodiments, the elongated nanostructures may be silicon nanowires, for example. Elongated nanostructures may be n- or p-doped semiconductors. The elongated nanostructures may be of any material which suitably provides for a photovoltaic device, in accordance with various embodiments. Suitable semiconductor materials may include, but are not limited to, silicon (Si), silicon germanium (SiGe), germanium (Ge), gallium arsenide (GaAs), indium phosphide (InP), GaInP, GaInAs, indium gallium arsenide (InGaAs), indium nitride (InN), selenium (Se), cadmium telluride (CdTe), Cd—O—Te, Cd—Mn—O—Te, ZnTe, Zn—O—Te, Zn—Mn—O—Te, MnTe, Mn—O—Te, oxides of copper, carbon, Cu—In—Ga—Se, Cu—In—Se, and combinations thereof. Suitable conducting materials include, but are not limited to, degenerately doped silicon, metallic materials such as aluminum (Al), platinum (Pt), palladium (Pd), and silver (Ag), carbon nanotubes, and combinations thereof.

In some embodiments, the multilayered film and the conformal layers over the elongated nanostructures may include compositions that are p-doped and n-doped semiconductors. Non-doped layers may also be incorporated, and may include an intrinsic layer. Other layers serving as tunnel junctions separating photoactive junctions may be incorporated in tandem cell arrays. In one embodiment, portions of the various layers may constitute cells with crystalline parts of the device to form stacked p-n junctions. In another embodiment, portions of the various layers may constitute cells of stacked p-i-n junctions. In yet another embodiment, portions of the various amorphous layers may constitute a combination of stacked p-n and p-i-n junctions. In some embodiments, the cells may be separated by a layer serving as a tunnel junction.

The composition of portions of the various layers that constitute the photoactive junctions may be amorphous silicon (a-Si), amorphous silicon-germanium (a-SiGe), nanocrystalline silicon (nc-Si) and amorphous silicon carbide (a-SiC), for example. In one embodiment, such materials may be ordered about elongated nanostructure and on the substrate in layers of increasing band gap energy.

Typically, the total thickness of the combined amorphous layers may range from 5 Å to 50,000 Å. Alternatively, the conformal layers may have a relative thickness in a range from about 30 Å to about 4000 Å. The thickness may be adjusted to optimize current matching between junctions of different band gap energies. That is, the thickness of a given layer may be altered so that the photocurrents generated in each individual cell (i.e. each photoactive junction) are substantially equivalent. In some embodiments, a particular layer may include a tunnel junction. In such a case, the material composition may be a metal oxide, for example zinc oxide.

In device embodiments employing a layer of transparent conductive material, the transparent conductive material can be a transparent conductive oxide (TCO). In some such embodiments, the transparent conductive oxide is indium-tin-oxide (ITO). In some other such embodiments, the transparent conductive oxide is doped ZnO. Typically, the transparent conductive material has a thickness between about 0.05 µm and about 1 µm.

Where a nanotemplate is used on the tunnel junction layer, it may be made of a material such as anodized aluminum oxide (AAO), silicon dioxide ($SiO_2$), boron nitride (BN), silicon nitride ($Si_3N_4$), and the like. In some embodiments, the porous nanotemplate 910c may have a thickness (or an average thickness) of between about 0.1 µM and about 100 µm, wherein the porous nanotemplate may have a pore diameter (or an average diameter) of between about 1 nm and about 1 µm, and wherein the porous nanotemplate may have a pore density between about $10^3$ per $cm^2$ and about $10^{12}$ per $cm^2$.

Device Photoactive Junctions

Figure 2:
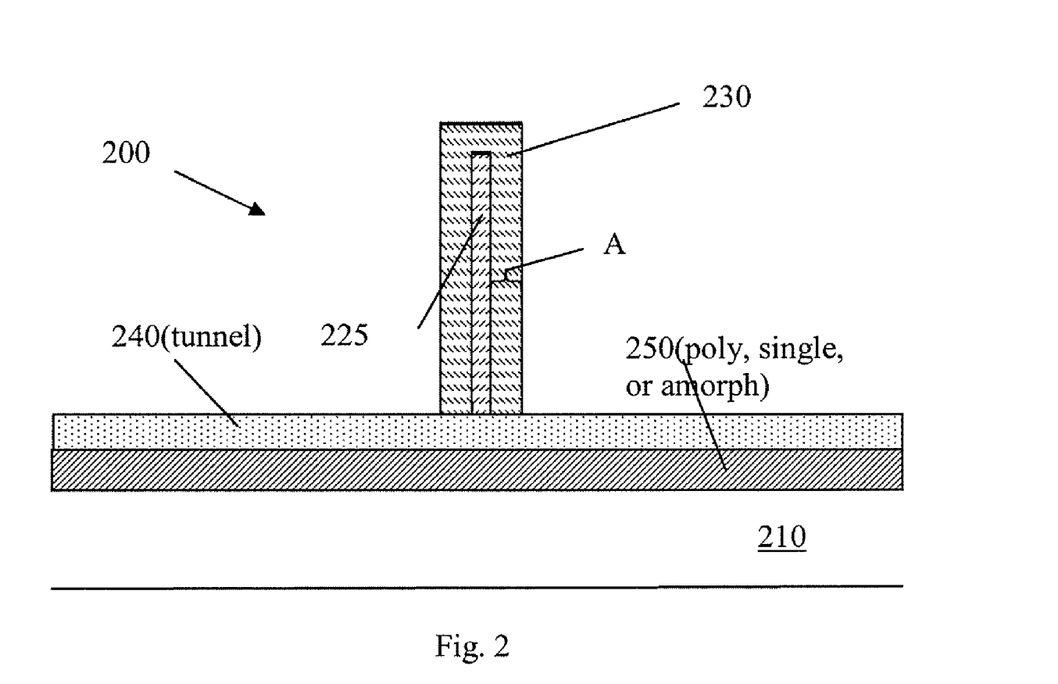
FIG. 2 shows a cross-sectional view of a device with two p-n junctions with a semiconducting substrate, in accordance with embodiments disclosed herein.

Referring to FIG. 2, in some embodiments, a photovoltaic device 200 may include a substrate 210 that is doped with a p-dopant or n-dopant. The simplest arrangement that generates a p-n junction is with a first layer 250 which has the opposite doping as the substrate. Layer 250 may be polycrystalline, single crystalline or amorphous. One skilled in the art will recognize that exact nature of layer 250 depends on the choice of substrate 210. Layer 240 serves as a tunnel junction which separates the photoactive junction generated with the elongated nanostructure 225. Layer 230 may be conformally deposited over elongated nanostructure 225. The doping of layer 230 and elongated nanostructure 225 may be opposite to each other, such as to establish the junction.

In some embodiments, any one of layer 250 and layer 230 may be compositionally graded across their thickness (indicated as A for layer 230). That is near the interface with substrate 210, layer 250 may be substantially intrinsic and as the layer is built up increased doppant is introduced to generate a charge-separated junction. Likewise, near the interface with elongated nanostructure 225, layer 230 may be substantially intrinsic and increase in doping across its thickness A.

In FIG. 2 neither a template nor thin film is shown (for simplicity), however, by way of example, where a template is present conformal layer 230 may be disposed only over structure 225. Alternatively, in the absence of a template, conformal layer 230 may extend and cover the surface tunnel junction 240 in a continuous conformal layer. Thus, layer 230 extends between each elongated nanostructure 225 along the surface of tunnel junction layer 240. Further conformal layers may be deposited to define further stacked junctions and similarly, each successive layer may extend along the surface of the previous layer between nanostructures 225. One skilled in the art will recognize that the extension of the layers between the wires may be beneficial to reduce shorting between the wires.

Figure 3:
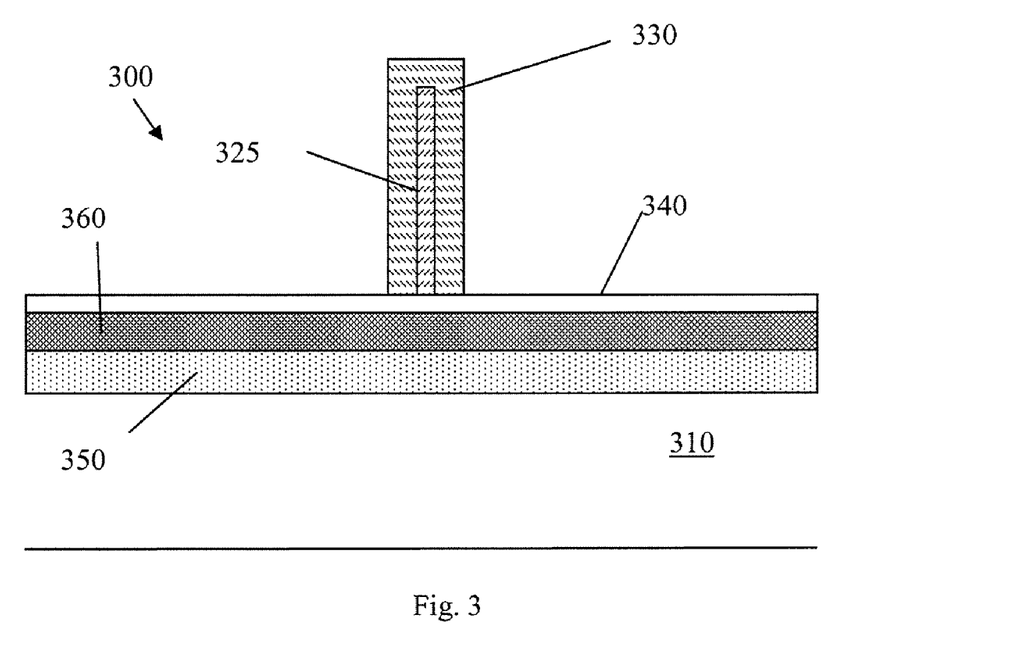
FIG. 3 shows a cross-sectional view of a device with two p-n junctions with a substrate that is not a semiconductor, in accordance with embodiments disclosed herein.

As shown in FIG. 3, substrate 310 of a photovoltaic device 300 need not be part of a photoactive junction. That is, substrate 310 may be insulating or conducting. The first layer 350 deposited may have a first doping and layer 360 the opposite doping. This defines a first p-n junction. Prior to building the array of elongated nanostructures 325, a tunnel junction layer 340 is provided. Conformal coating with layer 330 defines a further p-n junction. Again, layers 330 and 360 may be compositionally graded across their thickness as described above. Further conformal layers may also be deposited over layer 330.

Figure 4:
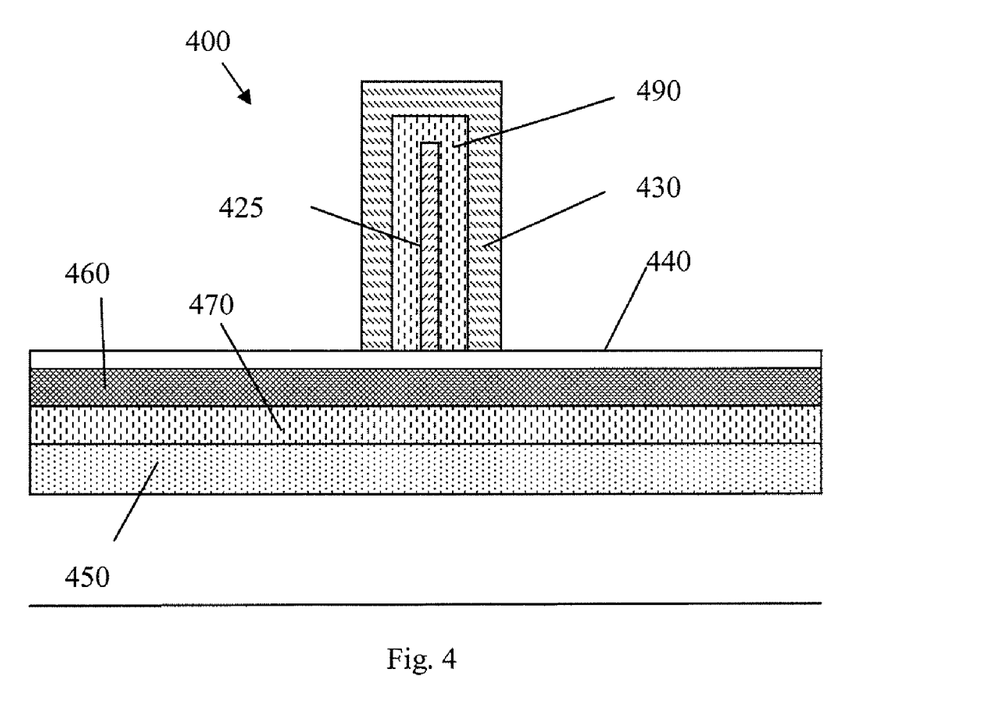
FIG. 4. shows a cross-sectional view of a device with two p-i-n junctions with a substrate that is not a semiconductor, in accordance with embodiments disclosed herein.

With reference to FIG. 4, in other embodiments, intrinsic layers may be incorporated between the p-doped and n-doped layers. Device 400 in FIG. 4 shows the incorporation of intrinsic layer 470 between doped layers 450 and 460. Likewise, intrinsic layer 490 is placed between doped layer 430 and elongated nanostructure 425. The cells created by these two p-i-n junctions are separated by tunnel junction layer 440. One skilled in the art will recognize that further layers defining other junctions (p-n or p-i-n) may be incorporated prior to placing the elongated nanostructures 425 on a top tunnel junction layer. Likewise, further junctions may be conformally coated over the elongated nanostructure 425, provided there is a separation of the cells with a tunnel junction layer. Thus, any number of photoactive junctions may be assembled conformally over the nanostructures 425 within the constraints of the space available between each elongated nanostructure. In addition to these spatial considerations, each cell will ideally vary in band gap energy to capture the largest possible available spectrum of light energy. In some embodiments, the largest bandgap energy will be the top cell (where light first enters) in a multi-junction array.

Figure 5:
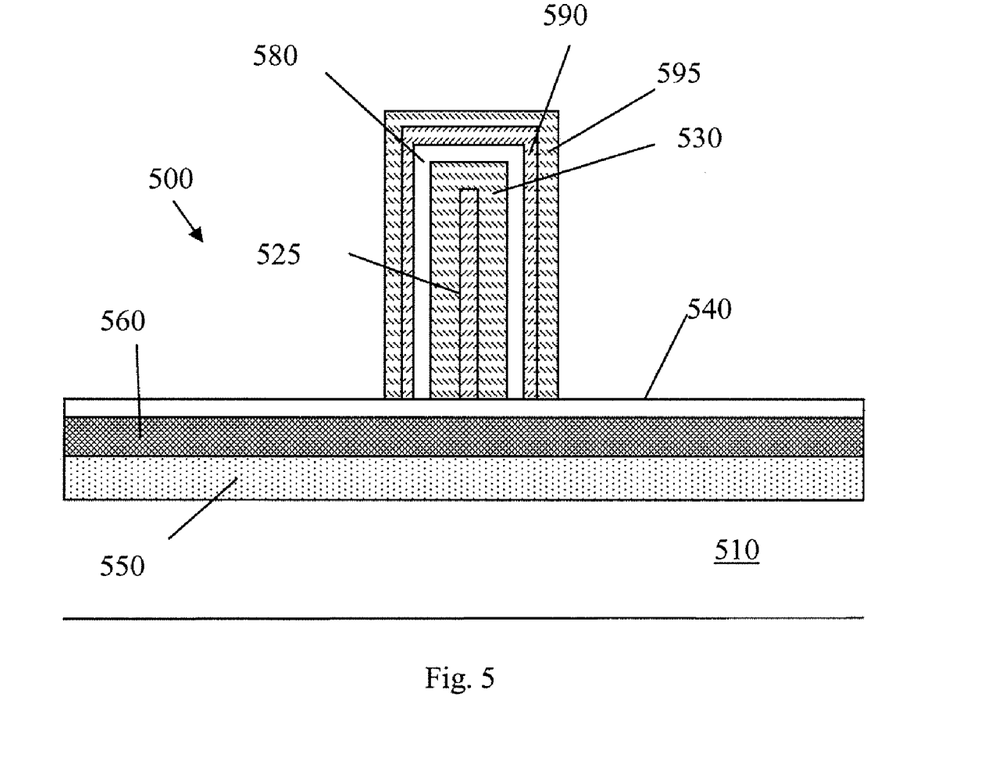
FIG. 5 shows a cross-sectional view of a device with three p-n junctions with a substrate that is not semiconductor, in accordance with embodiments disclosed herein.

FIG. 5 provides an example of a multifunction array device 500 that incorporates further photoactive junctions over elongated nanostructure 525. A first p-n junction is defined by the deposition of layers 550 and 560 on substrate 510 (insulating or conducting). A tunnel junction 540 separates this from the subsequent junctions built about nanostructure 525. A middle junction is formed from nanostructure 525 and first layer 530. Another tunnel junction 580 separates the middle junction from the top junction formed by the conformal deposition of layers 590 and 595. As for FIG. 2, neither a template nor thin film is shown for simplicity, but the extension of each successive conformal layer applies as above in the absence of a template.

Finally, in some embodiments, the substrate may incorporate a bottom contact. In some embodiments, the layer of transparent conductive material provides a top contact. Depending on the intended use, the device can be configured for either top and/or bottom illumination.

Device Fabrication

Figure 6:
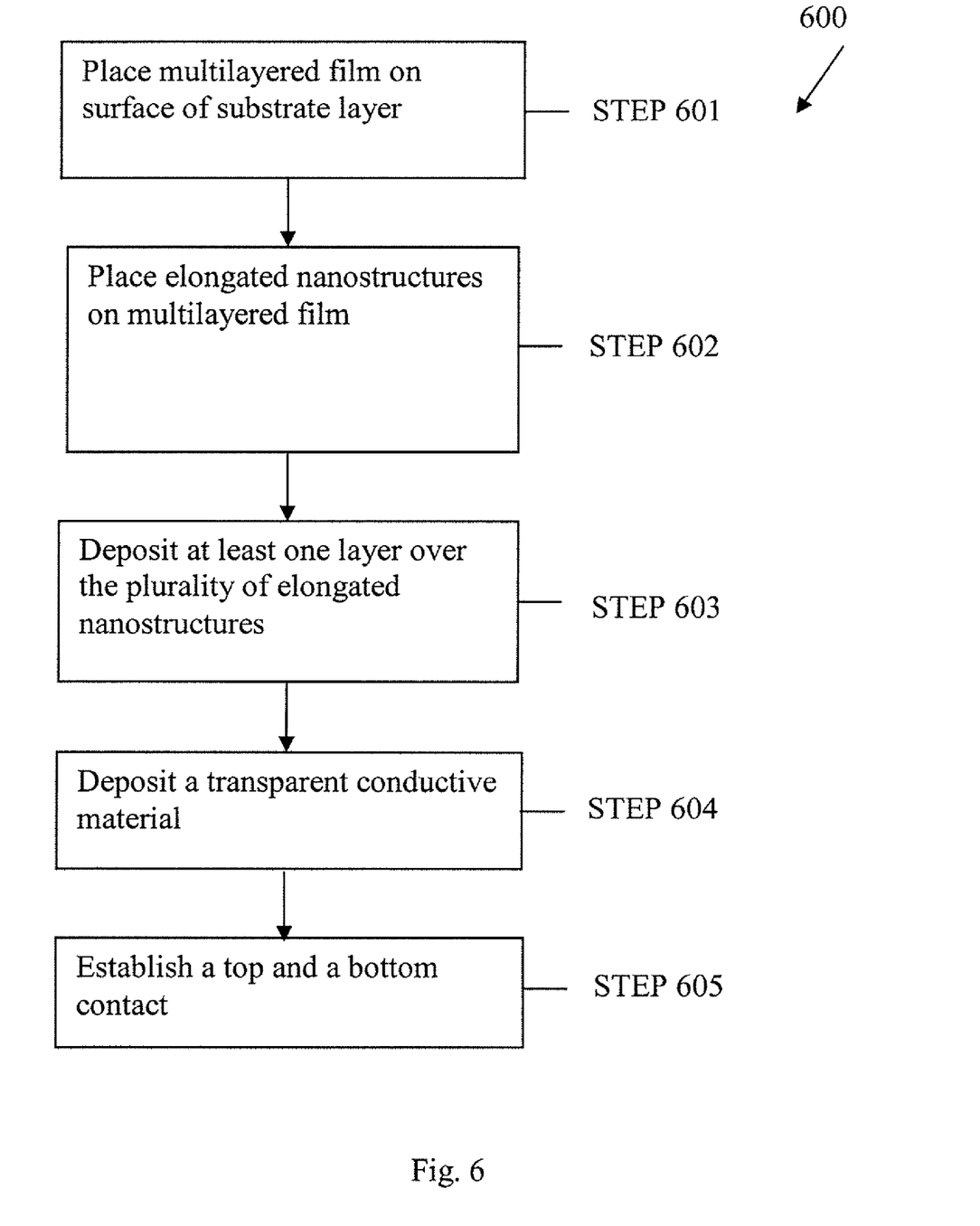
FIG. 6 shows a flow diagram for a method of constructing a photovoltaic device, in accordance with embodiments disclosed herein.

In some embodiments, referring to FIG. 6, a method 600 for making the above-described nanostructure-based photovoltaic devices may proceed as follows. Referring to FIG. 6, a first step (Step 601) places a multilayered film over at least one surface of a substrate. Next (Step 602), elongated nanostructures are placed on the multilayered film. (Step 603) at least on layer is conformally deposited over the elongated nanostructure. In the absence of a template, the conformal layer extends on the surface of each successive layer extending between neighboring nanostructures. (Step 604) a conductive transparent material is deposited as a layer over the amorphous layer; and (Step 605) top and bottom contacts are established, which may be operable for connection of the device to an external circuit. The top contact may be disposed on the TCM and the bottom contact may be disposed on a surface of the substrate opposite the elongated nanostructures or integrated within the substrate.

In some above-described method embodiments, the elongated nanostructures are provided by growing them via a method selected from the group consisting of chemical vapor deposition (CVD), metal-organic chemical vapor deposition (MOCVD), plasma-enhanced chemical vapor deposition (PECVD), hot wire chemical vapor deposition (HWCVD), atomic layer deposition (ALD), electrochemical deposition (ECD), solution chemical deposition (SCD), and combinations thereof. In some embodiments, the elongated nanostructures are provided by catalytically growing them from metal nanoparticles, where the metal nanoparticles may reside in a nanoporous template, and wherein the metal nanoparticles may include a metal selected from the group consisting of gold (Au), indium (In), gallium (Ga), platinum (Pt), and iron (Fe).

As described above, template 145 may be a nanoporous template. For example, in some embodiments, a nanoporous template is employed to grow elongated nanostructures such as is described in commonly-assigned U.S. patent application Ser. No. 11/141,613, filed 27 May, 2005, which is incorporated by reference in its entirety. Nanostructures are grown using CVD, MOCVD, PECVD, HWCVD, ALD, ECD, SCD, sputtering, and combinations thereof.

In some such above-described method embodiments, the step of conformally-depositing the multilayered film is carried out using a technique selected from the group consisting of CVD, MOCVD, PECVD, HWCVD, ALD, MBE sputtering, and combinations thereof. In the absence of a template for the nanostructure formation, the conformal deposition will provide a layer over the elongated nanostructures and between each nanostructure.

Solar Panels

In some embodiments, the present invention is directed to a solar panel that may include at least one multi-junction nanostructure-based photovoltaic device, as disclosed herein. The solar panel isolates each device from its surrounding atmospheric environment and permits the generation of electrical power. In some embodiments, the photovoltaic devices may be horizontally mounted and, thus, obviate the need for tracking systems that track the sun. The solar panel, in some embodiments, may be in an integrated power system (residential or commercial), in consumer electronics, or in solar power stations. It is noted that fabrication of solar panels is well known in the art and hence will not be described in detail herein for the sake of brevity.

While embodiments disclosed herein relate to the application of PV devices in solar cells, one skilled in the art will appreciate that such devices may also be incorporated into optoelectronic devices. For example, PV devices may be incorporated into LEDs or lasers.

Finally, embodiments of the present invention provide bifacial and/or multi-junction nanostructured photovoltaic devices that may exhibit high efficiencies and may be resistant to light induced degradation. The photovoltaic devices constructed in accordance with embodiments disclosed herein may optimize absorption of light and may minimize recombination at hetero-junction interfaces. Other benefits may include low cost and ease of fabrication, especially in embodiments that include a primarily silicon-based cell.

It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

What is claimed is:
1. A photovoltaic device comprising:
a substrate having two surfaces;
a multilayered film disposed on at least one of the at least two surfaces of the substrate; the multilayered film comprising (a) at least one layer that is part of a first photo- active junction, and (b) a first tunnel junction layer disposed over the first photoactive junction;
a plurality of elongated nanostructures disposed on the first tunnel junction layer of the multilayered film, wherein the first tunnel junction layer is located between the substrate and the nanostructures; and
a conformal layer disposed on the nanostructures, wherein the conformal layer forms a part of a second photoactive junction; the second photoactive junction separated from the first photoactive junction by the first tunnel junction layer.

2. The photovoltaic device of claim 1, wherein the substrate is selected from the group consisting of a p-doped semiconductor, an n-doped semiconductor, an insulator, and a conductor.

3. The photovoltaic device of claim 1, wherein the multilayered film further comprises at least one selected from the group consisting of a polycrystalline layer, a single crystalline layer, an amorphous layer, and a second tunnel junction layer.

4. The photovoltaic device of claim 1, wherein the multilayered film further comprises elements of at least one selected from the group consisting of a p-doped layer, an n-doped layer and an intrinsic layer.

5. The photovoltaic device of claim 1, wherein the multilayered film is a single layer having a graded dopant concentration across its thickness.

6. The photovoltaic device of claim 1, wherein the conformal layer comprises elements of at least one selected from the group consisting of a p-doped layer, an n-doped layer, an intrinsic layer, and a second tunnel junction layer.

7. The photovoltaic device of claim 1, wherein the conformal layer is a single layer having a graded dopant concentration across its thickness.

8. The photovoltaic device of claim 1, wherein the conformal layer comprises at least one selected from amorphous silicon, amorphous silicon-germanium (SiGe), Ge, GaAs, InGaP, and amorphous silicon carbide (SiC).

9. The photovoltaic device of claim 1, wherein the conformal layer comprises a relative thickness in a range from about 5 Å to about 50,000 Å.

10. The photovoltaic device of claim 9, wherein the conformal layer comprises a relative thickness in a range from about 30 Å to about 4000 Å.

11. The photovoltaic device of claim 9, wherein the relative thickness is chosen for current matching.

12. The photovoltaic device of claim 1, wherein the at least one photoactive junction comprises a p-n junction.

13. The photovoltaic device of claim 1, wherein the at least one photoactive junctions comprises a p-i-n junction.

14. The photovoltaic device of claim 1, wherein the plurality of elongated nanostructures comprises silicon nanowires.

15. The photovoltaic device of claim 1, wherein a nanoporous template is disposed on the multilayered film.

16. The photovoltaic device of claim 1, wherein the plurality of elongated nanostructures are integrated in the photoactive junction.

17. The photovoltaic device of claim 1, wherein the multilayered film, the plurality of elongated nanostructures and the conformal layer are in a bifacial arrangement relative to the at least two surfaces of the substrate.

18. The photovoltaic device of claim 1 further comprising;
a transparent conductive material (TCM) disposed over the conformal layer.

19. The photovoltaic device of claim 18 further comprising;
a top and a bottom contact operable for connecting the photovoltaic device to an external circuit.

20. A solar panel comprising at least one photovoltaic device of claim 1, wherein the solar panel isolates such devices from its surrounding atmospheric environment and permits the generation of electrical power.

21. The solar panel of claim 20, wherein the photovoltaic devices can be mounted in a manner that is independent of a system for tracking the sun.

* * * * *

UNITED STATES PATENT AND TRADEMARK OFFICE
CERTIFICATE OF CORRECTION

PATENT NO.        : 7,977,568 B2
APPLICATION NO.   : 11/622275
DATED             : July 12, 2011
INVENTOR(S)       : Korevaar et al.

It is certified that error appears in the above-identified patent and that said Letters Patent is hereby corrected as shown below:

In the Specifications:

In Column 8, Line 12, delete "µM" and insert -- µm --, therefor.

In Column 9, Line 20, delete "multifunction" and insert -- multi-junction --, therefor.

In the Claims:

In Column 11, Line 27, in Claim 5, delete "is a single" and insert -- comprises a --, therefor.

In Column 12, Line 24, in Claim 18, delete "comprising;" and insert -- comprising: --, therefor.

In Column 12, Lines 27-28, in Claim 19, delete "comprising;" and insert -- comprising: --, therefor.

Signed and Sealed this
Twentieth Day of November, 2012

David J. Kappos
*Director of the United States Patent and Trademark Office*